(12) United States Patent
Nowodzinski

(10) Patent No.: US 8,860,283 B2
(45) Date of Patent: Oct. 14, 2014

(54) ELECTROSTATIC ACTUATOR OF A MOBILE STRUCTURE WITH IMPROVED RELAXATION OF TRAPPED CHARGES

(75) Inventor: Antoine Nowodzinski, Saint-Ismier (FR)

(73) Assignee: Commissariat a l'Energie et aux Energies Alternatives, Paris (FR)

( * ) Notice: Subject to any disclaimer, the term of this patent is extended or adjusted under 35 U.S.C. 154(b) by 174 days.

(21) Appl. No.: 13/406,026

(22) Filed: Feb. 27, 2012

(65) Prior Publication Data

US 2012/0223614 A1  Sep. 6, 2012

(51) Int. Cl.
*H02N 11/00* (2006.01)
*H02N 1/00* (2006.01)
*B81B 3/00* (2006.01)

(52) U.S. Cl.
CPC .......... *H02N 1/006* (2013.01); *B81B 2201/038* (2013.01); *B81B 3/0086* (2013.01)
USPC ............ 310/309; 310/300; 310/308; 310/310

(58) Field of Classification Search
CPC .............................. H02N 1/004; H02N 1/006
USPC .......................................... 310/300, 308–310
See application file for complete search history.

(56) References Cited

U.S. PATENT DOCUMENTS

| | | | | |
|---|---|---|---|---|
| 8,339,013 B2* | 12/2012 | Miyazaki | | 310/309 |
| 8,569,937 B1* | 10/2013 | Kubena et al. | | 310/366 |
| 8,742,644 B2* | 6/2014 | Aoyagi et al. | | 310/309 |
| 2004/0125536 A1 | 7/2004 | Arney et al. | | |
| 2006/0012940 A1 | 1/2006 | Song et al. | | |
| 2006/0102455 A1* | 5/2006 | Chiang et al. | | 200/181 |
| 2006/0138604 A1 | 6/2006 | Kirby et al. | | |
| 2007/0074731 A1* | 4/2007 | Potter | | 128/899 |
| 2007/0181411 A1* | 8/2007 | Ikehashi et al. | | 200/181 |
| 2009/0121662 A1* | 5/2009 | Miyazaki | | 318/116 |
| 2013/0026880 A1* | 1/2013 | Aoyagi et al. | | 310/300 |

FOREIGN PATENT DOCUMENTS

WO    WO 00/31819    6/2000

OTHER PUBLICATIONS

Peng et al., "Impact of Humidity on Dielectric charging in RF MEMS Capacitive Switches," IEEE Microwave and Wireless Components Letters, May 2009, pp. 299-301, vol. 19—No. 5.
Zaghloul et al., "On the influence of environment gases, relative humidity and gas purification on dielectric charging/discharging processes in electrostatically driven MEMS/NEMS devices," Nanotechnology, 2011, pp. 1-22, vol. 22.

* cited by examiner

*Primary Examiner* — Terrance Kenerly
(74) *Attorney, Agent, or Firm* — Oliff PLC

(57) ABSTRACT

The device comprises a first actuating bump made from electrically conducting material with a first contact surface. A second actuating bump made from electrically conducting material is facing the first actuating bump. An electrostatic actuating circuit moves the actuating bumps with respect to one another between a first position and another position. The actuating circuit comprises a device for applying a higher potential on the second actuating bump than on the first actuating bump. A film of electrically insulating material performs electric insulation between the first and second bumps. The electrically insulating material film comprises an interface with a positive ion source and is permeable to said positive ions.

14 Claims, 2 Drawing Sheets

ELECTROSTATIC ACTUATOR OF A MOBILE STRUCTURE WITH IMPROVED RELAXATION OF TRAPPED CHARGES

BACKGROUND OF THE INVENTION

The invention relates to an electrostatic actuator of a mobile structure such as an electrostatic switch, a mobile membrane of an acoustic sensor or source, the actuator comprising first and second bumps between which an electric field is created.

STATE OF THE ART

Micro electromechanical systems (MEMS) have been constantly developed in recent years and are now present in a very large number of technological sectors.

Integration of these devices in immediate proximity to electronic chips results in a gain in compactness and consumed energy which paves the way for new applications and new markets.

Electrostatic actuating devices occupy an important place as they are easy to produce, in particular to form a device of switch type in which an intermittent electric contact is established between two contact bumps.

As illustrated in FIG. 1, the switch comprises a substrate 1 provided with a securedly attached mobile arm 2. Substrate 1 comprises a first contact bump 3 associated with a first electrode. Mobile arm 2 comprises a second contact bump 4 associated with a second electrode. Second contact bump 4 moves between an insulating position and a contact position with first contact bump 3.

First 5 and second 6 actuating bumps serve the purpose of actuating mobile arm 2 electrostatically. First 5 and second 6 actuating bumps each comprise an electrically conducting part, and a potential difference is applied between the two electrodes to actuate the mobile arm. An actuating circuit 7 is used to move mobile beam 2 with respect to substrate 1. One of the actuating bumps is covered by an electrically insulating material 8 so as to prevent any short-circuiting between the two bumps.

The potential difference applied between the two bumps 5 and 6 creates an electrostatic force which moves the two contact bumps towards one another. In this way, by application of an intermittent electric field between the two actuating bumps, movement between the mobile electrode and the fixed electrode is obtained.

In use, electric charges are progressively introduced and trapped in the layer of electrically insulating material 8 separating the two actuating areas 5 and 6. These accumulated charges in insulating material 8 have the effect of creating a parasitic potential which modifies the operating conditions of the device. In certain cases, the switch may remain stuck even when the potential difference between the two electrodes is zero.

Documents from Zhen Peng et al. "Impact of Humidity on Dielectric Charging in RF MEMS Capacitive Switches" (IEEE Microwave and Wireless components letters. Vol. 19 N°5 May 2009) relates to the effect of moisture on charges present in dielectrics disposed between two electrodes of a capacitive switch.

Different devices are fabricated with two types of dielectrics separating the two electrodes of the switch: a silicon oxide and a silicon nitride. Various atmospheres are studied and "Pull-in" voltage value is investigated for different parameters as a function of the content of the atmosphere located between the two electrodes. The author indicates that it is critical to package switches in <1% relative humidity.

SUMMARY OF THE INVENTION

It has been ascertained that a requirement exists to provide a device equipped with an intermittent contact, degradation of the performances of which in time is reduced and fabrication of which is easy to implement.

This requirement tends to be met by providing for the device to comprise:
- a first bump made from electrically conducting material with a first contact surface,
- a second bump made from electrically conducting material with a second contact surface,
- an electrostatic actuating circuit to move the first and second bumps with respect to one another, the actuating circuit comprising means for applying a potential difference between the first and second bumps,
- a positive ion source devoid of water vapour,
- a film of electrically insulating material performing electric insulation between the first and second bumps, the electrically insulating material film comprising an interface with the positive ion source and being permeable to said positive ions.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

Figure 1:
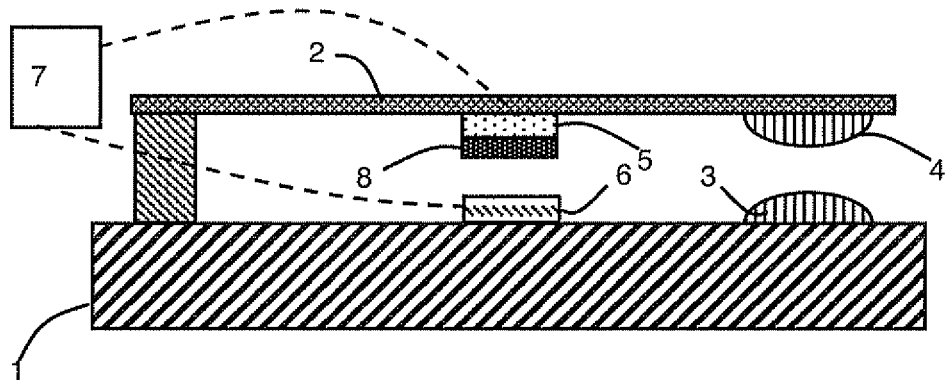
FIG. 1 illustrates a switch, in schematic manner in cross-section.

As illustrated in FIG. 1, substrate 1 is provided with a securedly attached mobile arm 2. Substrate 1 comprises a first contact area 3, corresponding in this example to a contact bump, associated with a first electrode. Mobile arm 2 comprises a second contact area 4 which also corresponds in this example to a contact bump and which is associated with a second electrode. Second contact bump 4 moves between a contact position with first contact bump 3 and another position, for example a rest position or a contact position with another contact bump. This configuration corresponds for example to an actuator of switch type or to a sensor.

Figure 2:
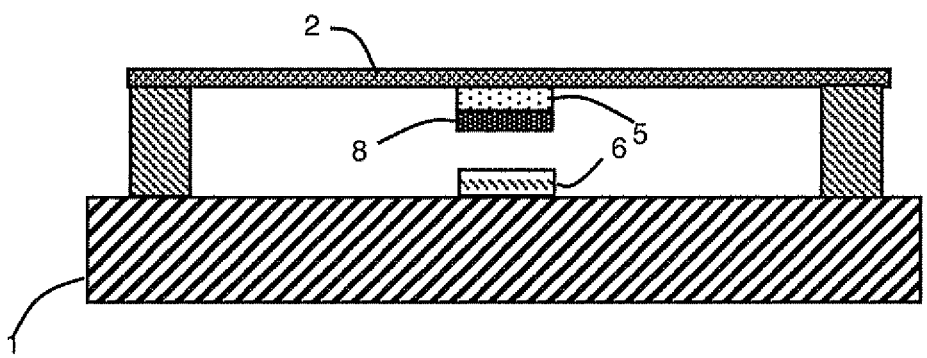
FIG. 2 illustrates an acoustic sensor or source, in schematic manner in cross-section.

In another configuration illustrated in FIG. 2, the contact bumps are not present and mobile beam 2 is a membrane which acts for example as acoustic sensor or source.

Figure 3:
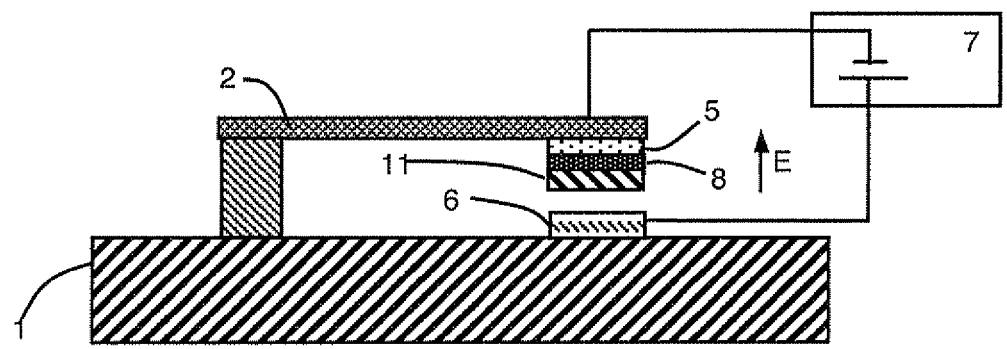
FIG. 3 illustrates an actuator provided with an electrode with a positive ion source, in schematic manner in cross-section.

As illustrated in FIG. 3 which only represents a part of the device, the electrostatic actuator comprises first 5 and second 6 actuating bumps which are mobile with respect to one another. First 5 and second 6 actuating bumps move between a first position which is for example the common contact position of contact bumps 3 and 4 and a second position, for example a rest position.

In the first position, there may be a physical contact between the two actuating bumps 5 and 6 or an absence of physical contact as mobile beam 2 opposes this contact. In the first position, the distance between the two bumps 5 and 6 is minimal. The second position can correspond to a rest position or to repulsion of mobile beam 2 with respect to substrate 1.

In another embodiment that is not represented, the position of first 5 and second 6 actuating bumps is reversed with respect to substrate 1.

First 5 and second 6 actuating bumps each have a main surface. The main surfaces of the two actuating bumps are facing one another. In the case of contact between first 5 and second 6 actuating bumps, a pressure is exerted on the bumps and on one or more elements located between the two actuating bumps.

The device comprises an electrostatic actuating circuit 7 to move actuating bumps 5 and 6 with respect to one another between the first position and another position.

Electrostatic actuating circuit 7 comprises a device for generating an electric field between the two actuating bumps 5 and 6. The electric field has the effect of creating a force which tends to move the two actuating bumps 5 and 6 towards one another to reach the first position.

First 5 and second 6 actuating bumps are each made from electrically conducting material, for example from a doped metallic or semiconductor material, which participates in generation of the electric field E between the two actuating bumps. In this way, the electric field lines connect first bumps 5 to second bumps 6.

An electrically insulating film 8 material is arranged between first 5 and second 6 actuating bumps. Electrically insulating film 8 prevents any electric contact, any short-circuiting, between the two actuating bumps 5 and 6. In the event of common contact, first 5 and second 6 bumps exert a pressure on electrically insulating film 8.

Electric field E passes through electrically insulating material film 8. Electrically insulating material film 8 comprises two opposite main surfaces facing the actuating bumps. Electrically insulating film 8 comprises a plurality of lateral surfaces which join the main surfaces to one another.

Electrically insulating film 8 performs electric insulation between first 5 and second 6 actuating bumps and at least intermittently presents an interface with first actuating bump 5. Physical contact between film 8 and first bump 5 can take place in the common contact position between the two bumps 3 and 4 whether there is contact between bumps 5 and 6 or not or during movement of first bump 5 to tend towards the first position.

According to the embodiments used, electrically insulating material film 8 is arranged on one of the actuating bumps or between the two actuating bumps. One of the main surfaces of film 8 can form the surface which covers the actuating bumps.

Electrically insulating film 8 can be formed by one or more electrically insulating materials. Electrically insulating film 8 is for example a silicon oxide, a silicon nitride, or a hafnium oxide.

Electrostatic actuating circuit 7 to move the actuating bumps comprises a device for applying a higher voltage on second actuating bump 6 than on first actuating bump 5. In this way, the electric field existing between the two actuating bumps has its lowest potential (for example negative) applied on first actuating bump 5 and its highest potential (for example positive) applied on second actuating bump 6. The electric field is directed from second bump 6 to first bump 5, i.e. the potential increases from bump 5 to bump 6.

In this configuration, when the first position is obtained, for example when physical contact takes place between first actuating bump 5 and second actuating bump 6, i.e. when electric field E is the highest, injection of negative charges, for example electrons, takes place from the electrically conducting part of first bump 5 in the direction of second bump 6. Injection of charges can take place before the first position has been reached. It suffices for film 8 to be in contact with first bump 5.

The negative electric charges are trapped by electrically insulating film 8 which is in physical and therefore electric contact with first bump 5.

Electrically insulating film 8 can be arranged on one of the two actuating bumps as illustrated in FIG. 2. Film 8 then forms part of the mobile or static electrode.

An additional electrically insulating film 10 can also be used on second bump 6 in addition to film 8 on first bump 5. This additional film 10 enables both the actuating bumps to be covered by an electrically insulating material.

Additional electrically insulating film 10 enables the total thickness of insulating material which is present, at the minimum, between the two actuating bumps to be controlled. This precaution enables the electric installation of the structure and the reliability of the device to be controlled while preventing electric field E from reaching the threshold breakdown value in electrically insulating layers 8 and/or 10.

The device comprises a positive ion source 11 which is in contact with electrically insulating film 8. In preferential manner, the positive ions are chosen from H+, Li+, Ca+, K+ and Na+ as they present a great mobility in the materials commonly used to form electrically insulating film 8. Other positive ions can be envisaged. The positive ions move in electrically insulating film 8. Positive ion source 11 presents an interface with electrically insulating film 8 which is permeable to the emitted ions. The positive ions source is devoid of water vapour. Advantageously, a getter for water vapour is used in the device.

The positive ion source can be in solid, liquid or gaseous form. Preferentially, the positive ions source comprises a solid portion.

The positive ions penetrate into electrically insulating film 8 and are electrostatically attracted to the trapped negative charges which enables this parasitic charge to be eliminated by forming an electrically neutral element.

As the negative electric charges are injected from first actuating bump 5, the majority of the charges are located close to the interface between these two materials. It is then interesting to place the positive ions rapidly next to the charges to neutralize them. For this purpose, the actuator can comprise means for moving the positive ion source towards the interface between electrically insulating film 8 and source 11.

The positive ions are thus able to reach the majority of the negative electric charges located in the core of electrically insulating film 8 within a reasonable time period. Electrically insulating film 8 and the positive ions are chosen such as to have a structure comprising a film permeable to the selected positive ions.

In a preferred first embodiment, the main surface of electrically insulating film 8 is not flat, but comprises surface patterning. The surface patterning corresponds to a variation of the thickness of the electrically insulating material. Patterning enables the developed surface of the electrically insulating material to be increased thereby facilitating insertion of a large quantity of positive ions in film 8.

The thick part of film 8 enables the minimum space that exists between the two actuating bumps 5, 6 to be controlled.

The part presenting a reduced thickness enables movement towards the interface between film 8 and source 11 and access to the lateral surfaces of the thick part.

In other words, electrically insulating material film 8 comprises a continuous film having a constant thickness which is covered by a plurality of patterns spaced apart from one another. The continuous film of insulating material prevents short-circuiting between the two actuating bumps.

Surface patterning results in the presence of a blind hole in electrically insulating film 8 which opens onto one of its main surfaces or onto a lateral surface. Positive ion source 11 is situated at least in the blind hole.

The hole can also take the form of one or more trenches which open onto one or more lateral surfaces of insulating film 8, the longitudinal axis of the trench therefore being parallel to the main surfaces. In preferential manner, the hole and/or trench penetrate over at least a half of the thickness of electrically insulating film 8 in order to encourage transit of the ions into film 8 and to reach the trapped negative charges more easily.

The hole can also be a pass-through hole which joins two lateral surfaces.

The hole(s) or trench(es) formed in electrically insulating film 8 can be of any shape.

Positive ion source 11 is arranged in the hole and therefore penetrates into electrically insulating film 8. In this way, the distance separating the positive ion source from the interface between the first electric contact and insulating film 8 is reduced. When film 8 comprises a thin area and a thick area, source 11 is advantageously located above the thin area, i.e. in the thickness of film 8 defined by the thick area.

In this way, the positive ions reach the core of insulating film 8 more easily. They therefore have a greater facility to reach the trapped charges to eliminate the latter.

Figure 4:
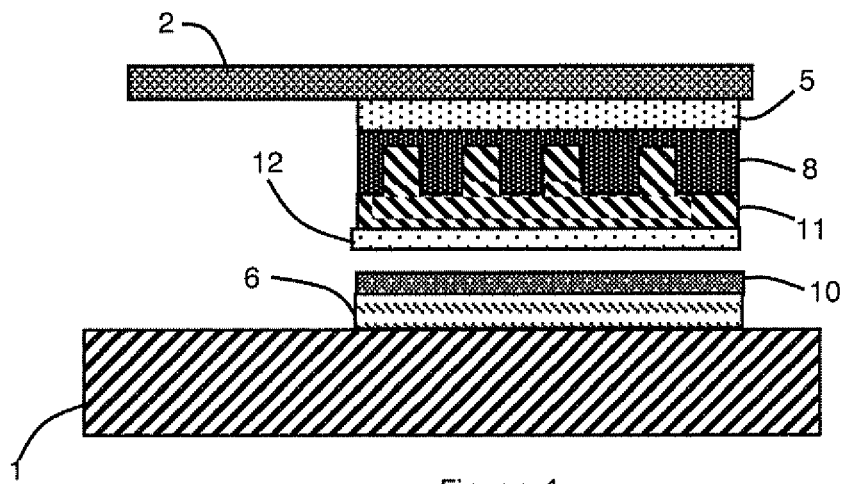
FIGS. 4 and 5 illustrate a part of two actuators having a positive ion source supplying an electrically insulating film, in schematic manner in cross-section.

In a variant of the previous embodiment which is illustrated in FIG. 4, positive ion source 11 is covered by an electrically insulating material, for example a covering film 12. This particular stacking enables the positive ion source to be electrically insulated in the case where the latter is electrically conducting. Covering film 12 also enables the interactions of positive ion source 11 with the outside to be limited. In another particular embodiment, the covering film is made from an electrically conducting material.

Figure 5:
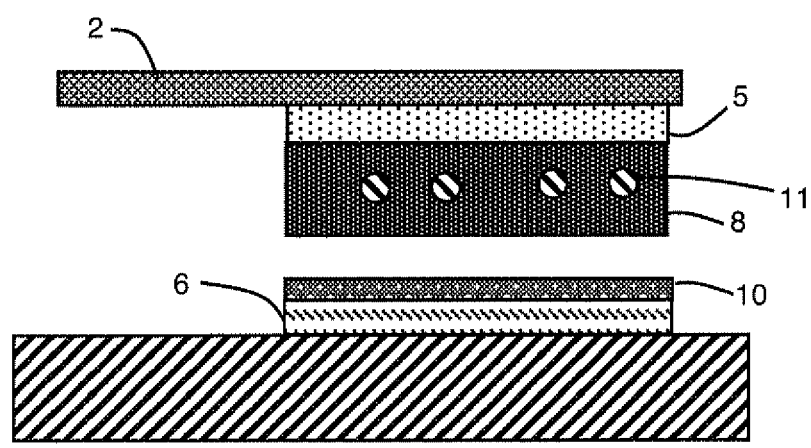

In another preferred embodiment illustrated in FIG. 5 and which can be combined with the previous embodiments, electrically insulating film 8 comprises one or more islands or nodules as positive ion source 11. The nodules forming positive ion source 11 are completely coated in film 8. The nodules are thus directly arranged in the core of film 8 which, for the positive ions, reduces the distance to be covered in order to reach the trapped charges.

Positive ion source 11 is for example a gaseous atmosphere containing hydrogen. Positive ions source 11 can be made from a material in solid, liquid or gaseous form which contains lithium, calcium, potassium or sodium in a form able to release the required ions.

In a preferred embodiment, the gaseous atmosphere is associated to a positive ion source in solid form which enables the input of positive ions to be better controlled and preserved. In advantageous manner, solid source comprises ion source of Li+, Ca+, K+ and Na+ which enable a larger quantity of ions than a hydrogen-based atmosphere to be delivered. The positive ion source can comprise a solid part and a part with an other form.

In a particular embodiment, positive ion source 11 is a film made from lithium, calcium, potassium or sodium or one of their alloys which is deposited on electrically insulating film 8 to provide the required ions.

In another embodiment, the device comprises a preferably sealed enclosure so as to control the operating atmosphere of the electrical contacts.

In order to control the supply of positive ions when the source is in liquid or gaseous form, it is interesting to use a reservoir material which performs conditioning of the positive ion source without hampering transit of these ions.

In a particular embodiment, positive ion source 11 is formed by a reservoir material which is filled by a liquid or gaseous material able to release the desired ions. The reservoir material can be a porous material, for example porous silicon, which is filled by a material able to supply positive ions. Electrically insulating film 8 is at least partially covered by the reservoir material (FIGS. 3 and 4) or the reservoir material is inserted into insulating film 8 (FIG. 5). The reservoir material is filled by a material able to supply positive ions, for example water, water vapor, a lithium-, calcium-, potassium- or sodium-based material. In this particular embodiment, water vapour can be used in the reservoir material.

In a preferred embodiment, the reservoir material fills the hole formed in electrically insulating film 8. The positive ions are thus placed in immediate proximity to the core of the electrically insulating film.

In an alternative embodiment, the reservoir material is covered by electrically insulating covering film 12.

Covering film 12 enables the reservoir material to be covered and limits leakage of positive ions or source material from electrically insulating film 8. This point is particularly interesting when a getter is used in the enclosure delineating the working atmosphere of mobile beam 2 and when the getter reacts with the material supplying the positive ions.

In another embodiment, an additional positive ion source is integrated on second actuating bump 6 with film 10, if the electrons can be injected up to electrically insulating film 10. What has been described for first bump 5 can then be used for second actuating bump 6.

The invention claimed is:

1. An electrostatic actuator comprising:
    a first bump made from electrically conducting material with a first contact surface,
    a second bump made from electrically conducting material with a second contact surface,
    an electrostatic actuating circuit to move the first and second bumps with respect to one another, the actuating circuit comprising means for applying a potential difference between the first and second bumps,
    a positive ion source devoid of water vapour,
    a film of electrically insulating material permeable to positive ions performing electric insulation between the first and second bumps and comprising an interface with the positive ion source, wherein negative charges are introduced and trapped into the film, and wherein the positive ions penetrate into the film and are electrostatically attracted to the trapped negative charges so as to form electrically neutral elements.

2. The actuator according to claim 1, wherein the electrically insulating film comprises a blind hole and the positive ion source is situated at least in the blind hole.

3. The actuator according to claim 1, wherein the positive ion source forms at least one nodule coated in the electrically insulating film.

4. The actuator according to claim 1, wherein the positive ions are selected from hydrogen, lithium, sodium, potassium and calcium ions.

5. The actuator according to claim 1, wherein the positive ion source is formed by a porous material filled by a liquid or gaseous material releasing the positive ions.

6. The actuator according to claim 1, wherein the positive ion source comprise a solid part.

7. The actuator according to claim 1, wherein the first and second bumps are arranged in a closed cavity comprising a water vapor getter.

8. The actuator according to claim 7, wherein a covering layer covers the positive ion source.

9. The actuator according to claim 1, wherein the electrically insulating film is situated on the actuating bump subjected to the lowest potential, the other actuating bump being covered by an additional electrically insulating film.

10. The actuator according to claim 9, wherein an additional positive ion source supplies the additional electrically insulating film.

11. The actuator according to claim 1, further comprising a mobile beam that is configured to move a first end of the mobile beam.

12. The actuator according to claim 11, wherein the mobile beam is a bending beam such that the mobile beam is configured to be bendable.

13. The actuator according to claim 11, wherein the first bump is disposed at the first end of the mobile end.

14. The actuator according to claim 11, wherein the first bump is moveable to a contact position and a non-contact position with the second bump such that the contact position is such that the first contact surface of the first bump contacts the second contact surface of the second bump and the non-contact position is such that the first contact surface of the first bump does not contact the second contact surface of the second bump.

* * * * *